United States Patent [19]

Sopko et al.

[11] 3,951,100

[45] Apr. 20, 1976

[54] CHEMICAL VAPOR DEPOSITION OF COATINGS

[75] Inventors: John F. Sopko, New Kensington, Pa.; Krishna Simhan, Fischbach, Germany

[73] Assignee: PPG Industries, Inc., Pittsburgh, Pa.

[22] Filed: Sept. 18, 1974

[21] Appl. No.: 507,656

Related U.S. Application Data

[62] Division of Ser. No. 315,393, Dec. 15, 1972, Pat. No. 3,850,679.

[52] U.S. Cl. .................................................. 118/48
[51] Int. Cl.² ........................................ C23C 13/08
[58] Field of Search .... 118/48–49.5; 427/50, 51, 69, 427/70, 91, 99, 109, 253, 124, 252; 239/597; 148/174, 175

[56] References Cited
UNITED STATES PATENTS

| | | |
|---|---|---|
| 3,438,803 | 4/1969 | Dubble et al. ............... 118/48 X |
| 3,684,469 | 9/1970 | Goelzer et al. ............ 427/252 X |
| 3,688,737 | 9/1972 | Augustsson et al. ........... 118/48 |
| 3,880,112 | 4/1975 | Spitz et al. ............... 118/48 X |

FOREIGN PATENTS OR APPLICATIONS 748,944   11/1946   Germany ............................ 118/49

*Primary Examiner*—Morris Kaplan
*Attorney, Agent, or Firm*—Donald Carl Lepiane; E. Kears Pollock

[57] ABSTRACT

A metal oxide coating is applied to a hot glass surface by contacting the surface with a mixture of carrier air, vaporized solvent and a vaporized metal containing reactant. The mixture is directed against the glass through an elongated, converging slot-nozzle, the interior surfaces of which have an increasing radius of curvature towards the exit end, nozzle at a Reynolds number exceeding 2500 with the nozzle-to-glass spacing at least 1.25 times the characteristic dimension of the nozzle.

14 Claims, 6 Drawing Figures

CHEMICAL VAPOR DEPOSITION OF COATINGS

This is a division of application Ser. No. 315,393, filed Dec. 15, 1972, now U.S. Pat. No. 3,850,679.

CROSS REFERENCES TO RELATED APPLICATIONS

This application is related to the following copending applications, all commonly assigned, all specifically incorporated by reference herein and all filed on even date herewith: "Nozzle to Chemical Vapor Deposition of Coatings", Ser. No. 315,394, filed Dec. 15, 1972, now U.S. Pat. No. 3,888,649 by Krishna Simhan; "Coating Composition Vaporizer", Ser. No. 315,395 filed Dec. 15, 1972, now abandoned, by John Sopko, and refiled as Ser. No. 533,610 on Dec. 17, 1974; Ser. No. 533,609 filed on Dec. 17, 1974, which is a divisional of Ser. No. 315,395; and "Method for Increasing Rate of Coating Using Vaporized Reactants", Ser. No. 315,384 filed Dec. 15, 1972, now U.S. Pat. No. 3,852,098 by Karl H. Bloss and Harald Molketin.

This application is also related to a copending application entitled "A Process for the Deposition of Films", Ser. No. 182,993, filed Sept. 23, 1971 based on a convention priority date of Sept. 29, 1970, by Hans-Jurgen Göetz, Helmut Lukas and Harald Molketin now abandoned. This application is also incorporated by reference herein.

BACKGROUND OF THE INVENTION

This invention relates to coating substrates, particularly glass substrates, with coatings comprised primarily of metal oxides. This invention more particularly relates to contacting a hot glass surface with the vapors of reactants which form metal oxide coatings upon contacting the hot glass surface.

Prior to the present invention it has been known that substrates may be coated with metal oxide coatings by contacting the substrates with solutions comprised of metal betadiketonates and the like dissolved in appropriate solvents. See the following U.S. Patents: Mochel, U.S. Pat. No. 3,202,054, Tompkins, U.S. Pat. No. 3,081,200, Donley et al, U.S. Pat. No. 3,660,061 and Michelotti et al, U.S. Pat. No. 3,652,246. These patents have disclosed to the public a number of chemical compositions which are suitable for the coating of glass with metal oxide coatings. In general, the techniques described for applying such coatings to glass taught in the prior art are methods wherein a liquid spray of coating composition is directed against a glass substrate surface to be coated. While these patents cover the application of particular metals or metal oxides to glass or other substrates, whether the compositions are applied in liquid or vapor form, they each disclose, as a best mode of application, contacting the substrate with the compositions in liquid form. In the development of techniques for applying vaporized coating compositions to heated substrates at atmospheric pressure certain difficulties have been encountered. It has been difficult to obtain coatings which are finely grained and uniform in appearance. Thick coatings have been produced by contacting the substrate with a liquid spray, but it has been extremely difficult if not impossible to obtain relatively thick films having visible light transmittances of below about 50% using brown vapor deposition techniques.

Vapor deposition processes have been known in the past. Most commercial embodiments of vapor deposition processes are processes carried out under subatmospheric pressure conditions. A number of techniques have evolved for enhancing the rate of film deposition using these techniques, for example, electrical fields, magnetic fields, and radio frequency or microwave excitation have been used to increase the momentum of reactant particles in vapor coating compositions during their applications. Also, wave guides have been used to direct the vapors of coating compositions to particularly confined target areas. See U.S. Pat. No. 3,114,652 to Schetky and U.S. Pat. No. 3,561,940 to Scholes.

The applicants have now discovered that the uniformity of films produced by chemical vapor deposition and the rate of chemical vapor deposition or film buildup may be significantly enhanced by directing reactant containing vapors through a nozzle against a substrate under particular flow conditions and preferably doing so at particular nozzle-to-substrate spacings.

SUMMARY OF THE INVENTION

A vaporizable coating reactant is vaporized into a vapor phase or gaseous carrier and is delivered through a nozzle and directed against a heated substrate. The substrate and reactant temperatures are such that upon contact with the substrate the reactant reacts to form an adherent coating on the substrate. In order to insure rapid, efficient and uniform deposition of coating the gaseous mixture containing the coating reactant is directed through the nozzle with a Reynolds number of at least 2500. For high speed coating of a continuous ribbon or sheet of glass it is preferred that the Reynolds number for the flowing gaseous mixture be at least about 5000.

The vaporizable coating reactant is generally a material which is solid or liquid at room temperature although the preferred reactants are usually solids at room temperature. The reactant may be vaporized by conventional methods, such as boiling if it is liquid, or if the reactant is a solid it may be vaporized by delivering it onto a heated plate, by admixing it with an inert material, such as sand, and passing a heated carrier gas through the mixture or by fluidizing it with a rapidly moving stream of carrier gas and heating the fluidized mixture. In the preferred embodiments of this invention the reactant is dissolved in an appropriate solvent, and the solution is sprayed into a hot carrier gas to vaporize the solvent and the reactant. A particularly preferred method of vaporization and apparatus for carrying out the method are the inventions of John Sopko and are the subject of his copending application Ser. No. 315,395.

The reactive coating materials which are preferred for use in the present invention are the pyrolizable organo metallic salts of the metals of Groups Ib through VIIb and of Group VIII of the Periodic Chart of the Elements. The preferred organo metallic salts which are employed are betadiketonates, acetates, hexoates, formates and the like. The acetylacetonates of iron, cobalt and chromium are particularly preferred as the reactive ingredients of the present coating compositions.

While the coating reactants which are preferred for use in this invention are pyrolyzable materials, other kinds of reactants may also be employed. For example, hydrolytic reactants, such as fluorinated betadiketonates, particularly acetylacetonates, and metal dicumenes, may be used. Also reactants may be employed which require the presence of substantial quantities of other cooperating reactants such as oxygen, hydrogen, halogens or the like. As already indicated the preferred method for vaporization involves an initial step of solution so that the reactant or reactants employed should be easily dissolved in a suitable solvent.

A variety of aliphatic and olefinic hydrocarbons and halocarbons are suitable as solvents in carrying out the methods disclosed here. Single component solvent systems, particularly a solvent system employing methylene chloride, are effectively employed in the present invention. Solvent systems employing two or more solvents are also found to be particularly useful.

Some representative solvents which may be employed in carrying out the present invention are: methylene bromide, carbon tetrachloride, carbon tetrabromide, chloroform, bromoform, 1,1,1-trichloroethane, perchlorethylene, 1,1,1-trichloroethane, dichloroiodomethane, 1,1,2-tribromoethane, trichloroethylene, tribromoethylene, trichloromonofluoroethane, hexochloroethane, 1,1,1,2-tetrachloro-2-chloroethane, 1,1,2-trichloro-1,2-dichloroethane, tetrafluorobromethane, hexachlorobutadiene, tetrachloroethane and the like.

Other solvents may also be employed, particularly as mixtures of one or more organic polar solvents, such as an alcohol containing 1 to 4 carbon atoms and one hydroxyl group and one or more aromatic non-polar compounds, such as benzene, toluene or xylene. The volatility of these materials makes their use somewhat more difficult than the above designated group of preferred halogenated hydrocarbons and halocarbons, but they have particular economic utility.

In the preferred practice of this invention a solution of a reactive organo-metallic salt in an organic solvent is directed to a vaporizing chamber. The vaporizing chamber is constructed so as to provide a heating element which heats the space surrounding the element to a temperature sufficient to vaporize the coating solution within that space rather than vaporizing the liquid only in contact with the heating element itself. A carrier gas is directed across and away from the heater to intercept the coating composition to mix with it enhancing its rate of vaporization and to carry the vapors through the heater to the substrate to be coated.

Vapors of the solvent and reactive organo metallic salt are directed from the vaporizer chamber to an elongated manifold disposed across the width of a heated substrate which is to be coated. Connected to this manifold is an elongated nozzle for directing the vapors against the substrate.

In a preferred embodiment, which is the subject of the copending application of Krishna Simhan entitled "Nozzle for Chemical Vapor Deposition of Coatings", and filed on even date herewith the elongated nozzle has as its minor cross-section a uniformly converging shape to provide for substantially continuous acceleration of the boundary layers of vapor passing through. The major cross-sectional dimension of the nozzle is slightly less than the corresponding substrate width so that a substrate placed in facing relation to the nozzle extends beyond the major dimension of the nozzle at both ends thereof. This relationship provides for the maintenance of a substantially uniform pressure drop along the major dimension of the nozzle and prevents the escape of a disproportionately large amount of vapors directed through the nozzle at each end of the nozzle and thus all vapors have good contact with the substrate.

The face of the nozzle disposed in facing relationship to a substrate to be coated is located in a position relative to a support for substrates to be coated such that the spacing between the nozzle face and the surface closest thereto during coating is at least 0.5 times the width of the nozzle at its exit. Preferably the spacing-to-nozzle width ratio is at least 0.65 and more preferably is between 0.9 and 5. In the most preferred embodiments the ratio is between 1.25 and 5.

The vaporizer and manifold of the coating apparatus of this invention are operated at sufficient pressure to cause vapor flow through the nozzle at a Reynolds number of at least 2500 and preferably at least about 5000 in order to insure rapid, efficient and uniform deposition of coating.

The apparatus of this invention may be employed to apply coatings to a variety of receptive substrates. Refractory substrates, such as, glasses, glass ceramics, ceramics, porcelain clad metals and the like are particularly amenable to coating by the present invention. Other substrates, such as, metals, plastics, paper and the like may also be coated according to the principles of this invention. In particular, this invention is useful to provide for the coating of flat glass with transparent metal oxide coatings. The resulting metal oxide coated flat glass articles have found particular utility in architectural applications.

DESCRIPTION OF THE PREFERRED EMBODIMENTS

In the practice of this invention it is important that the Reynolds number which characterizes the flowing vapors exiting from the nozzle and being directed against the substrate being coated be greater than about 2500.

While a Reynolds number of at least 1700 insures that vapor flow will be fully turbulent, it has now been discovered that the Reynolds number must be at least about 2500 in order for flow to be substantially uniform throughout the area of impingement against the substrate as evidenced by interferometric techniques and by the uniformity of resulting deposits.

The Reynolds number is defined by the following classic equation: $N_{Re} = W \cdot \rho \cdot L/\eta$. The Reynolds number is dimensionless. The symbols W, $\rho$ and $\eta$ represent the flow velocity, the density and the dynamic viscosity of the flowing vapor. L is a characteristic length defined at the point where the other variables are determined. According to known principals of hydraulics, the characteristic dimension L which is relevant in the defined relationship is the hydraulic diameter which is defined as four times the cross-sectional area of the nozzle exit divided by the wetted perimeter of the nozzle exit. The flow, density and vapor viscosity are all characterized in the equation as the values of these properties at the nozzle exit.

The present invention may be more fully appreciated from a detailed description of the apparatus and method which follows.

Figure 1:
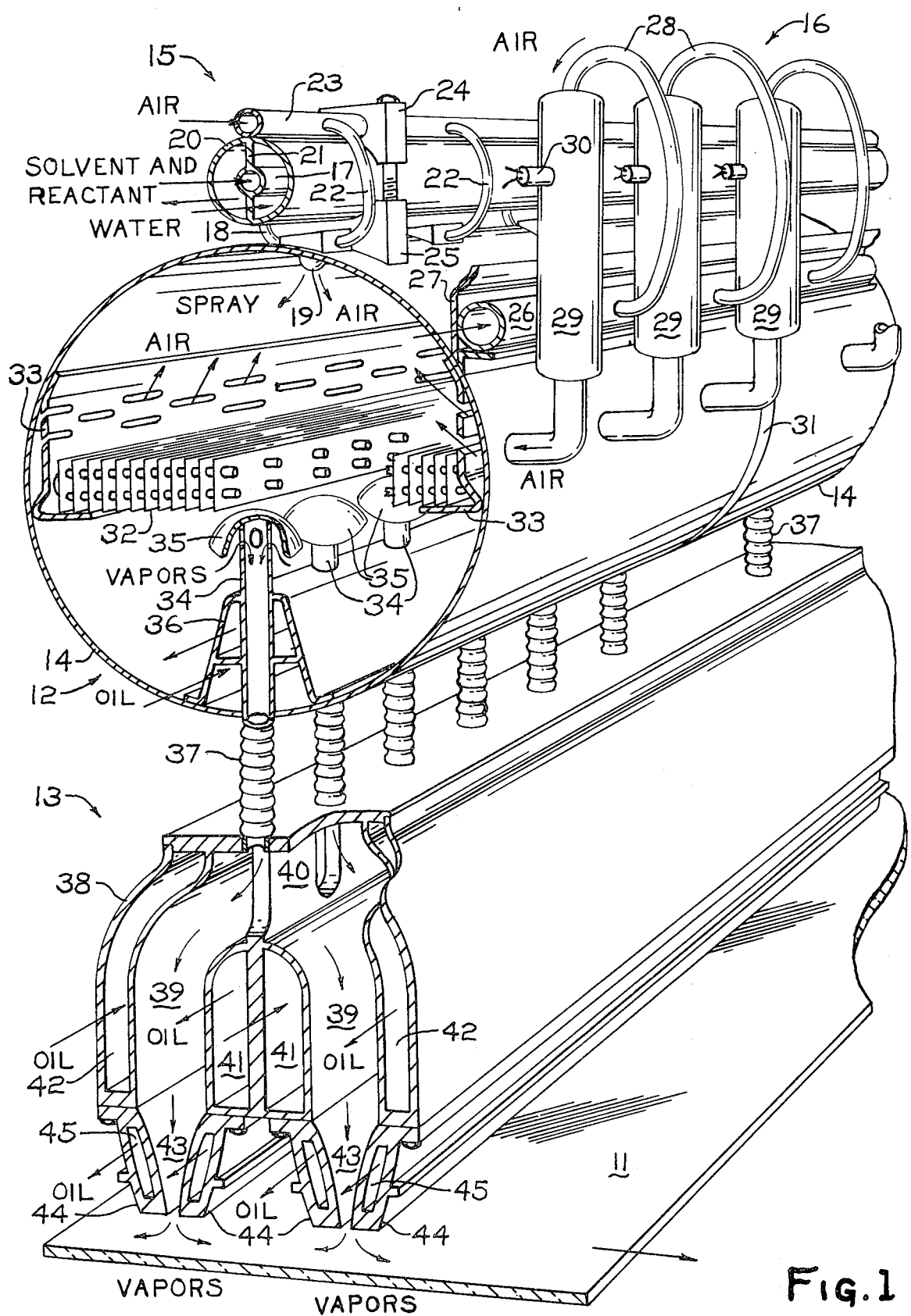
FIG. 1 is a partial, cutaway, perspective view of the preferred apparatus for practicing the present invention, showing the flow of vapors and other fluids employed in the practice of the invention.

Referring first to FIG. 1, a substrate, for example a sheet of glass 11, is provided for coating. The sheet of glass 11 is generally supported, preferably in a horizontal plane, and is generally supported by means which can translatably move or convey the glass sheet 11 along a path such as indicated by the arrow at the lower right of FIG. 1. Disposed in facing relation to the glass sheet 11 is the coating apparatus of this invention comprising a vaporizer assembly 12 and a vapor distribution assembly 13.

The vaporizer assembly 12 comprises a vaporizer chamber 14, which in a preferred embodiment of the invention is a cylindrical chamber containing elements for vaporizing reactants, which elements are further described below. The vaporizer assembly 12 further comprises means for supplying a reactant 15 and means for supplying a carrier gas 16.

A reactant is supplied through a solution line 17 to a series of solution feed lines 18, each of which is connected to a spray tip 19 having its discharge opening inside the vaporizer chamber 14. The solution line 17 is jacketed with a coolant line 20, which is divided into forward and return flow portions by a baffle 21. Atomization gas, preferably air, is supplied to each spray tip 19 through a series of atomization feed lines 22, all of which are connected to an atomization gas line 23.

The entire reactant supply means 15 is mounted onto the vaporizer chamber 14 by a series of caps 24 which surround the lines and are bolted or otherwise connected to a series of mounts 25 welded to the vaporizer chamber 14.

The carrier gas supply means 16 comprises a carrier gas manifold 26 mounted on the vaporizer chamber 14 by a bracket 27. Connected to the carrier gas manifold 26 are a series of carrier gas feed lines 28, each connected to a carrier gas preheater 29 which are in turn connected to the vaporizer chamber 14 in a manner such that heated carrier gas may be directed into the chamber. The preheaters 29 are preferably electrical resistance heaters, each having an electric power connection 30 connected to a source of controlled electric power (not shown).

The vaporizer chamber 14 may be a single structure, but if it is of extended length it is preferably of modular construction with a series of relatively short vaporizer chambers 14 connected end-to-end by vaporizer chamber couplings 31 which lock the individual chambers together.

Inside the vaporizer chamber 14 are elements for vaporizing a reactant and other materials such as a solvent. A heater 32 is mounted within the vaporizer chamber 14 in a manner such that the chamber is divided into two portions, one into which all incoming materials enter and one from which departing vapors leave. The heater 32 is so constructed that vapors may pass through it from the entrance portion to the exit portion of the vaporization chamber 14. A preferred heater is a fin and tube heat exchanger having a thermally controlled heat exchange fluid supplied to its tubes.

The heater 32 is mounted within the chamber 14 on mountings, which are efficiently also carrier gas distribution plates 33, welded or otherwise connected to the interior walls of the chamber 14. The carrier gas distribution plates 33 are so shaped and connected to the chamber 14 that an enclosed manifold space is formed with each plate 33 and the closely spaced chamber wall. The carrier gas distribution plates 33 are provided with a series of openings which permit the free flow of gas out into the entrance portion of the vaporizer chamber 14 where it mixes with sprayed reactant and solvent vaporizing them.

The gaseous mixture containing a reactant in the entrance portion of the vaporizer chamber 14 passes through the heater 32 which trims or finely controls the temperature of the mixture entering the exit portion of the vaporizer chamber 14. The heater 32 preferably has a high heat capacity relative to the mass of flowing gaseous mixture so that thermal stability is insured.

In the exit portion of the vaporizer chamber 14 are a series of vapor discharge lines 34, extending outward through the wall of the vaporizer chamber 14 and having several inlet openings near their interior ends. The interior end of each vapor discharge line 34 is preferably covered with an umbrella 35 which deflects any occasional particulate material, which enters the chamber or forms in the chamber thus, preventing it from clogging the vapor discharge line.

Surrounding the vapor discharge lines 34 is a vapor discharge heater 36. The vapor discharge heater 36 has two cavities, an inlet cavity and a return cavity which are connected to a recirculating heat exchange fluid system (not shown). During operation, hot fluid, such as oil, is circulated through the vapor discharge heater 36 to control the temperature of the gaseous mixture being discharged from the vaporizer chamber 14.

Connected to each vapor discharge line 34 is a coupling 37, preferably a flexible coupling, which connects the vaporizer assembly 12 to the vapor distribution assembly 13. The vapor distribution assembly 13 comprises a vapor manifold or plenum 38 having two vapor channels 39 separated by a dividing wall 40 and jacketed with inner and outer thermal control fluid cavities, 41 and 42. During operation, hot fluid, such as oil, is circulated through the inner and outer cavities to control the temperature of the gaseous mixture flowing through the vapor channels 39.

The vapor channels 39 of the plenum 38 open into nozzles 43, preferably converging nozzles. Each nozzle is formed of opposing nozzle wall members 44 connected to the plenum 38. Preferably each nozzle wall member 44 is provided with a cavity 45 through which hot fluid, such as oil, may be directed to precisely control the temperature of a gaseous coating mixture being directed through the nozzles 43 to the substrate 11.

The present coating apparatus and method may be employed in combination with a variety of other processes and substrates, such as paper making, metal sheet rolling and the like. The present method may be used to coat a continuous sheet or a series of discrete substrates. In the preferred embodiments of this invention a continuous glass sheet is coated. This may be a sheet produced by the plate process, by any sheet process (Colburn, Fourcault or Pittsburgh Pennvernon Process) or by a float process. The present invention can be used effectively to apply a coating to a substrate in a vertical, horizontal or otherwise oriented plane, and this feature is a particularly valuable and unique feature of this invention.

In a particularly preferred embodiment the present invention is used to coat a newly formed float glass ribbon. The ribbon could be easily coated on either major surface by the principles of this invention and the description which follows relates to coating the top surface of the glass ribbon.

Figure 2:
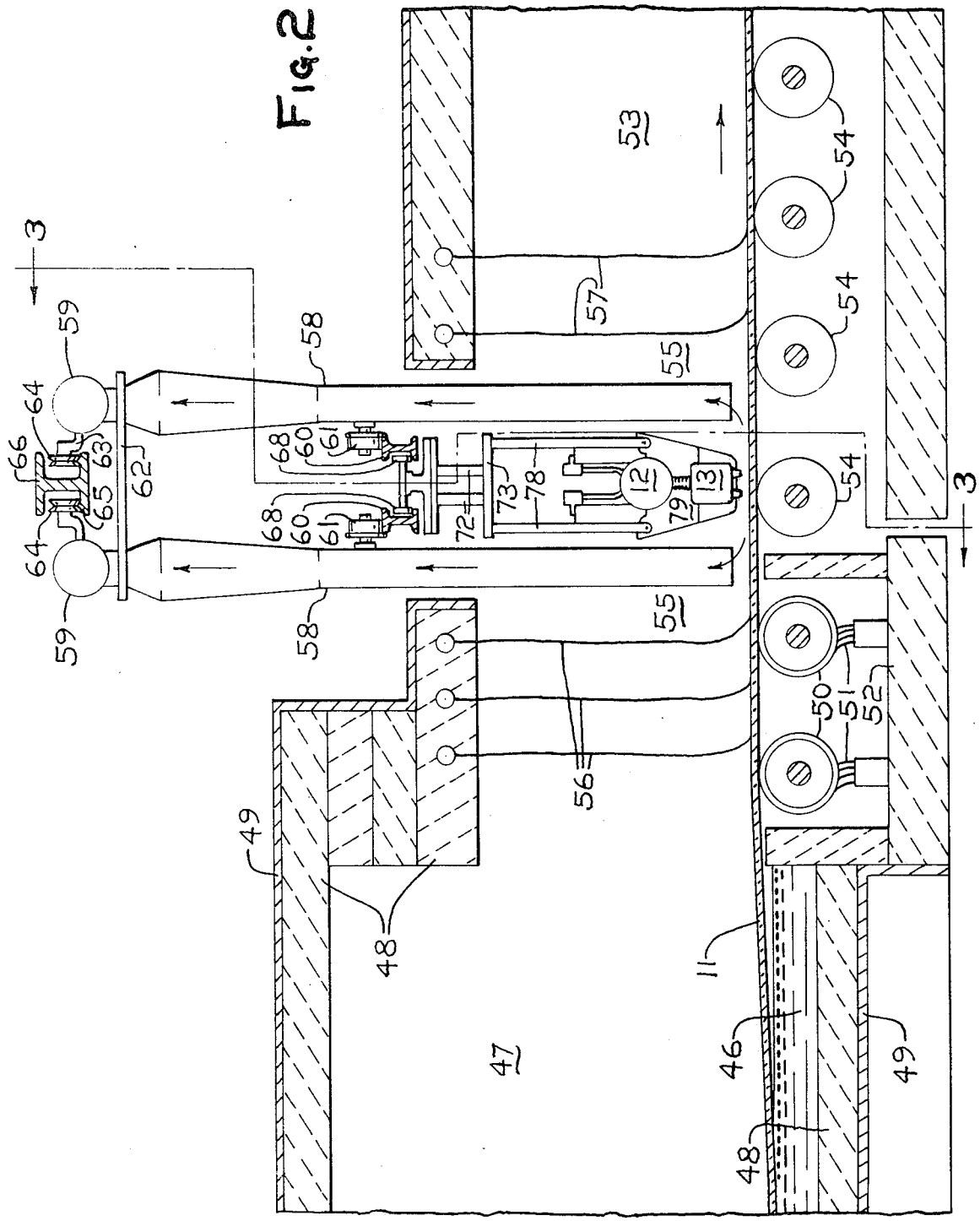
FIG. 2 is a partial sectional view of the preferred vaporizer, manifold and nozzle used in the practice of the present invention shown in combination with a sheet of float glass supported in facing relation to the nozzle.
Figure 3:
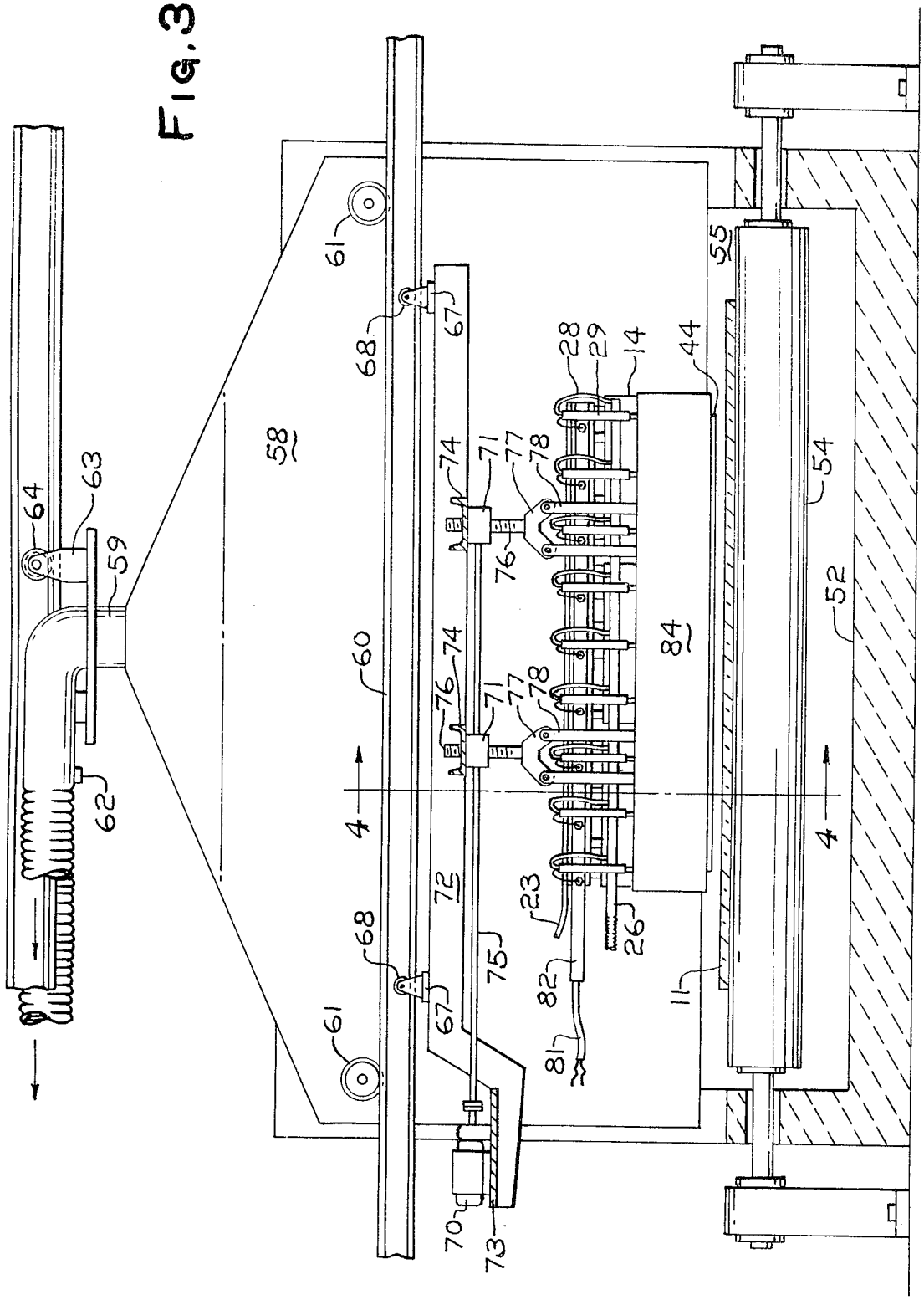
FIG. 3 is a partial sectional view of the preferred device of this invention taken along section line 3—3 of FIG. 2.
Figure 4:
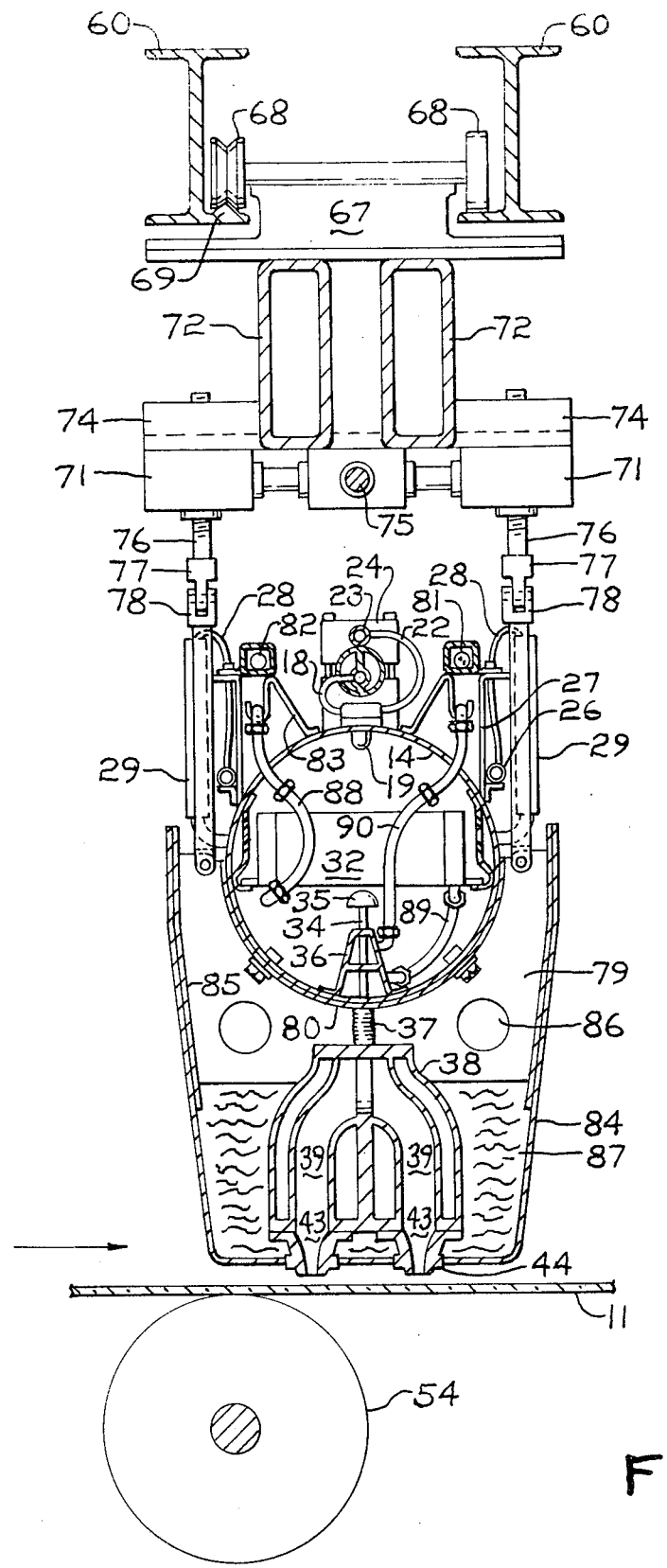
FIG. 4 is a partial sectional view of the preferred vaporizer of this invention taken along section line 4—4 of FIG. 3 showing the particular relationship of the heating element therein to the chamber space with its inlets, outlets and baffling arrangement to provide for the vaporization of the coating compositions employed in this invention within the space of the chamber rather than for vaporization in contact with the heating element itself.

Referring now to FIGS. 2, 3 and 4 as well as to FIG. 1, the apparatus of this invention may be observed in a particularly preferred environment, the space between a float forming bath and an annealing lehr.

A continuous glass ribbon 11 is shown on a bath of molten metal 46, such as molten tin, contained in a bath chamber 47 comprising refractory bottom, side and top walls 48 encased in metal sheathing 49.

The ribbon 11 is lifted from the molten metal 46 at the exit end of the bath chamber 47 on lift out rolls 50, which are suitably journaled and driven by conventional roll driving means connected to a driving motor (not shown). Carbon blocks 51 are spring loaded and press against the bottom of the rotating rolls 50 to remove any materials which may become deposited on the rolls. The carbon blocks 51 are supported within a refractory extension of the bath chamber 52. Material removed from the rolls which falls into this extension 52 may be easily removed on an intermittent basis.

The ribbon of glass 11 is conveyed into an annealing lehr 53 having a plurality of lehr rolls 54 therein. Conventional driving means is provided for rotating the rolls 54. Each lehr roll 54 exerts a tractive force on the glass of sufficient magnitude to convey the glass through the lehr where its temperature is controlled to release permanent stress and strain in the glass. The rolls 54 constitute part of a means for transporting newly formed float glass from the float bath chamber 47, through a vaporization coating chamber 55 and then through the annealing lehr 53.

The atmosphere within the bath chamber 47 is a reducing atmosphere containing nitrogen and a small amount of hydrogen in order to insure that oxidation of the molten metal 46 is inhibited. Generally the atmosphere contains about 90 to 99.9 percent nitrogen with the remainder being hydrogen. The atmosphere is maintained at a pressure slightly above ambient pressure, for example, 0.1 to 0.5 inch water to substantially prevent the ingress of ambient atmosphere into the bath chamber 47.

To retain the atmosphere and to permit the passage of the glass ribbon from the bath chamber 47, the exit end of the bath chamber is provided with a series of curtains or drapes 56 which trail on the glass ribbon and serve as means for segregating the slightly pressurized atmosphere of the vaporization coating chamber 55 from the bath chamber 47. These drapes or curtains 56 are usually made of flexible asbestos or fiber glass material which does not mar the glass and which withstands temperature of the environment, namely, a temperature of approximately 1000° to 1200°F. Additional drapes or curtains 57 of similar material are provided at the entrance of the lehr 53, the latter drapes serve as means for segregating the lehr 53 from the vaporization coating chamber 55.

The vapor coating chamber 55 is provided with vaccuum hoods 58 having inlets disposed both upstream, adjacent the bath chamber, and downstream, adjacent the lehr. The vacuum hoods 58 extend vertically upward to a pair of exhaust pipes 59 and are sufficiently spaced from one another to provide sufficient room for supporting I-beams 60 and for the vapor coating apparatus comprising vaporizer assembly 12 and vapor distribution assembly 13 along with associated equipment. The vacuum hoods 58 are movably supported on I-beams 60 by wheels 61 which rest on the top of the I-beams 60. The I-beams 60 are disposed transversely across the path of the ribbon of glass 11 moving from the bath chamber 47 to the lehr 53. The vacuum hoods are held in spaced relation by cross brace 62. The exhaust pipes 59 are mounted on brackets 63 on which are mounted wheels 64 which rest upon tracks 65 of a supporting overhead beam 66. The entire vacuum hood assembly comprising the vacuum hoods 58 and exhaust pipes 59 may be moved transverse to the path of the glass ribbon 11 to completely remove the assembly from the float line for maintenance and repair. This removal is accomplished by causing the assembly to move along beams 60 and 66 while rolling on the supporting wheels 61 and 64.

The vapor coater assembly is supported within the vapor coating chamber 55 from I-beams 60 by means of vapor coater support bracket 67. Mounted on the support bracket 67 are vapor coater support wheels 68. Vapor coater support wheels 68 rest on I-beams 60 one of which has a track 69 mounted on it. The shape of the track 69 and of the support wheel 68 engaging it is such as to prevent the lateral movement of the assembly with respect to the track and I-beams.

The vapor coater assembly comprises, in addition to the vaporizer assembly 12 and the vapor distribution assembly 13, a mechanical structure for supporting these operative elements. This mechanical structure includes a motor 70 and jacks 71 for raising and lowering the assembly to position it closer to or farther from the substrate to be coated.

Depending from vapor coater support bracket 67 are vapor coater cross arms 72. Mounted on cross arms 72 are a motor support 73 and jack supports 74. Mounted on the motor support 73 is the motor 70, preferably a DC variable speed motor. Connected to this motor 70 is a drive shaft 75 which is in turn connected to screw jacks 71. Within each jack 71 there is appropriate gearing for driving a screw shaft in a vertical motion.

Screw shafts 76 connect with the drive shaft 75 through jacks 71 connected to a gear. By driving the drive shaft 75 by motor 70 the screw shafts 76 are caused to move vertically to raise and lower the vapor coating assembly. Mounted on the screw shafts 76 are yokes 77. Connected to and depending from yokes 77 are support arms 78 which connect to cross plates 79.

Mounted on cross plates 79 is a vaporizer cradle support 80 to which is bolted or otherwise connected the vaporizer chamber 14.

As briefly described above, the preferred practice of this invention requires that a carrier gas, preferably air, be supplied to the vaporizer chamber 14 to mix with the atomized spray of coating composition coming from the spray nozzle tips 19 to enhance the rate of vaporization of the coating material and then to carry the mixture through the heater 32 to further heat the combination for ultimate delivery to the substrate to be coated. The carrier gas is supplied to the vaporizer from manifolds 26 which are preferably pipes mounted on the assembly by brackets 27. Flexible tubing 28 is connected to the carrier gas manifold 26 and directed through heating elements 29 to connectors passing through the wall of the vaporizer chamber 14 and entering the space formed by air distribution plates 33 with the wall of the vaporizer chamber. Power is supplied to heaters 29 from an electrical cable 81 which passes through a supporting distribution conduit 82 mounted on brackets 27 and 83.

The internal details of the vaporizer 12 which is preferably employed in the practice of this invention are further described in the copending application of John Sopko entitled "Coating Composition Vaporizer".

The structural characteristics of the presently preferred apparatus are apparent in FIGS. 2, 3 and 4. Unreacted or excess coating composition vapors and the carrier gas discharged from the nozzle 43 toward the substrate 11 fill the vapor coating chamber 55. Unreacted vapors and gases are removed from the chamber by vacuum hood 58. In order to minimize or avoid the buildup of deposits on irregular structural surfaces which might result in deposits flaking off and dropping onto the substrate 11 thereby causing defects the vapor coating assembly is encased within a vapor coater shield 84. The vapor coater shield 84 may be provided with reinforcement plates 85. It is connected to the coater assembly by being connected to cross plates 79. The cross plates, 79 as indicated before, are connected to the support assembly 78 and are further connected to the vaporizer cradle support 80. As already indicated, the vaporizer chamber 14 is connected to the vaporizer cradle support 80. The cross plates 79 are provided with access holes 86. The space between the vapor coater shield 84 and the vapor manifold 38 is preferably filled with a thermal insulation 87, such as mineral wool, asbestos or the like.

As shown in FIG. 3 the construction of a vapor coater assembly to span the entire width of a conventionally formed glass ribbon may be modular. Modular design is preferred for ease of maintenance and repair of the equipment. Individual vaporizer chambers 14 with appurtenent equipment are connected together to form an assembly which spans the entire ribbon width.

While the vaporizer 14 may be modular in design, the vapor distribution manifold 38 and the vapor nozzles 43 are preferably single units. In this way vapors are uniformly distributed across the width of the substrate which is to be coated.

Figure 6:
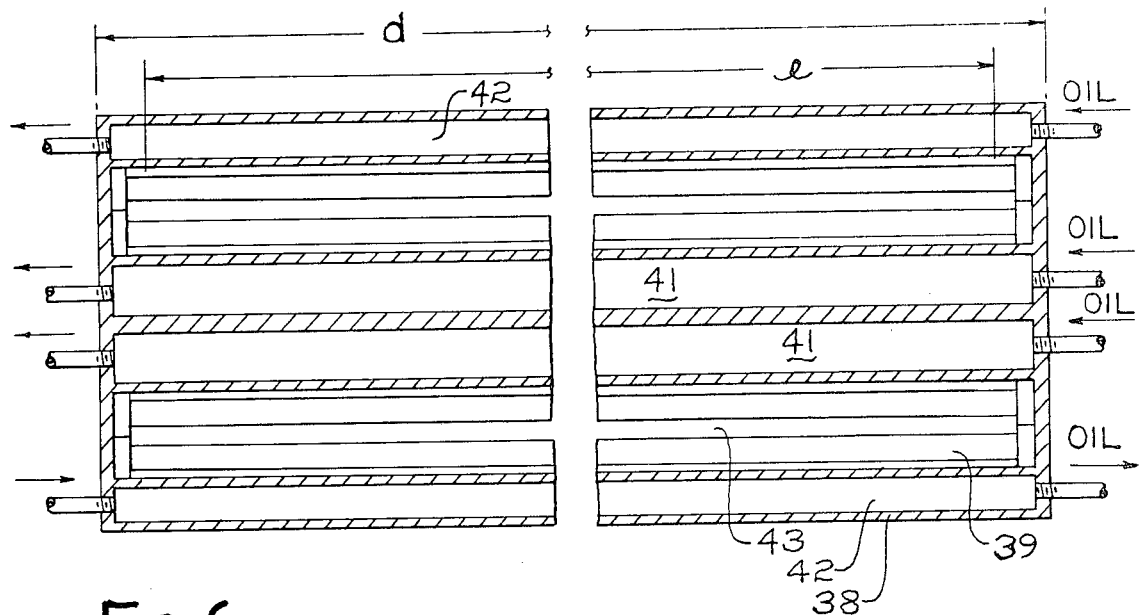
FIG. 6 is a sectional view of the preferred nozzle for use in the practice of this invention taken along section line 6—6 of FIG. 5.
Figure 5:
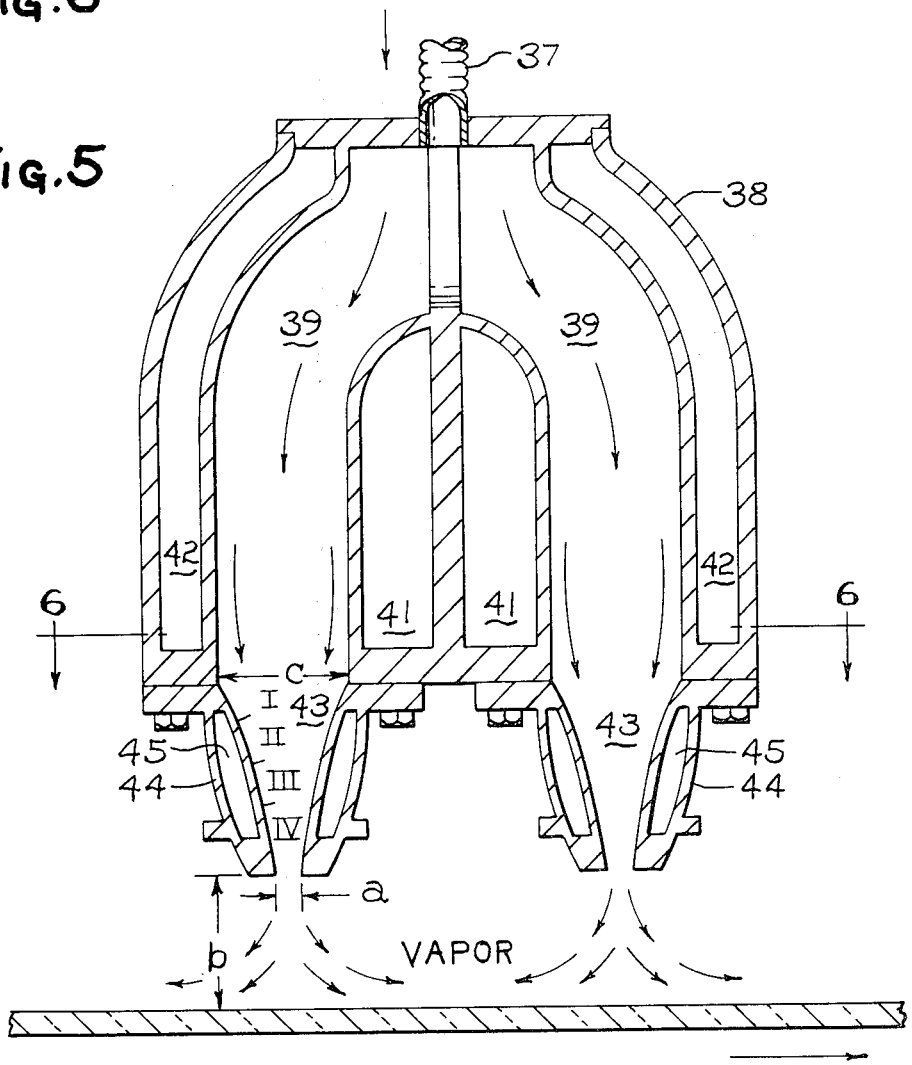
FIG. 5 is an enlarged sectional view of the preferred nozzle used in the practice of this invention along with a suitable manifold for distributing vapor to the nozzle.

Referring to FIGS. 5 and 6, the details of the vapor distribution manifold and the vapor nozzles may be appreciated.

The coating vapors are uniformly distributed along the substrate by the vapor manifold of plenum 38. The structure of a particularly preferred plenum 38 and nozzle 43 combination may be appreciated from the enlarged views of FIGS. 5 and 6. The transverse length of the plenum or manifold 38, which spans the width of a glass ribbon to be coated, is much greater than the width of the manifold. For example, in order to coat a glass ribbon having a width of about 10 feet the length of the manifold, $d$ shown in FIG. 6, will be approximately 10 feet as well. In general, the width of the manifold will be one foot or less.

The vapor manifold 38 comprises a plurality of vapor channels which are elongated and separated from one another at their exit ends but which meet in a common channel at their entrance. The plurality of couplings 37 which bring vapors from the vaporizer 14 to the manifold 38 are connected to the manifold 38 along this common channel entrance.

Each vapor channel 39 may preferably be constructed with at least two opposing curves so that the path of travel of vapors passing through the channel must change direction at least twice. In this manner the uniformity of vapor distribution along the length of the channel is enhanced. While baffles may be positioned within the channels to further interrupt the vapor flow and distribute the vapor along the length of the channels, the simple design without baffles but with changed flow direction is preferred. In the preferred design there are no areas of stagnation and no protruding bodies to create eddy flows of significant magnitude.

Surrounding the vapor channels 39 are cavities 41 and 42 for carrying a heating or cooling fluid as desired according to the cross current flows as illustrated in FIG. 6. These chambers 41 and 42 extend along the length of the vapor manifold 38 and are connected to a source of heating or cooling fluid (not shown). In the preferred embodiment hot oil is supplied to the chambers.

Connected to the vapor manifold 38 are nozzle wall members 44 forming nozzles 43 which direct the vaporized coating composition and carrier gas toward the substrate 11 which is to be coated. The nozzles 43 are elongated as seen in FIG. 6, and in plan view they appear as slots. The cross-section of the nozzle openings viewed parallel to the major slot dimension, $e$, illustrates that the preferred nozzles narrow considerably from their entrance to their exit. The contraction of each slot is such that vapor passing through the slot is continuously accelerated along the length of the slot. In this way the boundary layer of vapors adjacent the slot wall is minimized, and the perimeter of the slot is uniformly wet by the vapors such that the exiting vapors are uniformly directed against the substrate. The nozzles may be characterized by a contraction ratio, which is the ratio of inlet area to outlet area or in the nozzles shown in FIGS. 5 and 6 as $c/a$. The preferred flow conditions for obtaining efficient and uniform coating are described below and the conditions described are defined as the conditions at the exit end of the nozzles. The preferred nozzles are the subject of the copending application of Krishna Simhan entitled "Nozzle for Chemical Vapor Deposition of Coatings".

The minor dimension of each nozzle exit, indicated as $a$ in FIG. 5, dictates the spacing $b$ between the nozzle exit and the substrate. Preferably the ratio $b/a$ ranges from 0.75 to 10. In the most preferred embodiments the ratio $b/a$ is from 1.25 to 5. Within the most preferred range of spacing as indicated by the ratio $b/a$ the rate of coating deposition is substantially greater than at closer or more distant spacings.

Each vapor channel 39 preferably has a volume of at least about six minutes times the volumetric throughput of the channel. By having this capacity to hold up vapors passing through the channel the channel serves as a calming section to wash out in residual velocity variations resulting from the flow of discrete streams exiting from the flexible couplings 37. As mentioned before, the vapor channels 39 preferably reorient vapor flow tending to uniformly distribute the vapor along the length of the manifold 38. The configuration and size of the vapor channels 39 are observed to cooperate with the shape of the nozzles 43. If the contraction ratio, $c/a$, for the nozzles is increased, particularly above about 5 to 6, the capacity or volume of the vapor channels 39 may be decreased without detrimental effect.

Each nozzle 43 is formed of two members 44, each having a curved face, connected to the manifold 38 with their curved faces in facing relationship. Each member may be provided with a channel 45 for carrying a fluid, such as hot oil, to control the temperature of the vapors and gas being discharged. In the preferred embodiment hot oil passes through parallel channels 45 and then through channels 41 and 42. The temperature of the oil to and from the nozzles may be measured, and the temperature calculated from such measurements to be the nozzle temperature is the temperature employed in defining vapor flow conditions at each nozzle exit.

The curved surfaces defining the flow region of the nozzles are smoothly machined to avoid creating minute obstructions or scratches that would impart local disturbances to the vapor and gas flow. In a preferred embodiment nozzle members are made of machined steel or other base metal, and the curved interior surfaces are plated with an easily worked metal such as gold or other precious metal. A metal finish of at least about 64 microinch and preferably about 16 microinch is satisfactory. When the contraction ratio, $c/a$ is sufficiently great the metal finish may be less smooth without effect.

The curvature of the nozzle interior surfaces is such that the radius of curvature is least at the entrance and greatest (approaching infinity) at the exit. In a most preferred embodiment the radius of curvature monotonically (and preferably constantly) increases as a function of distance from the entrance toward the exit of the nozzle. For ease in the construction of the apparatus the nozzle members 44 are machined to distinctly different radii in separate regions (I, II, III and IV for example) along the path length of the nozzle. Each region is smoothly machined to blend with the next.

The exit edges of the nozzle members are preferably sharp, well defined corners so that the substrate facing portion of the nozzle members will not be wet by exiting vapors and gas. The substrate facing edge of each nozzle member 44 should be about 90° with respect to the face of the member and preferably will be about 87° so that the edge has an angle of about 3° up away from the nozzle exit with respect to the plane of the substrate.

The flow conditions which are maintained in the practice of this invention are defined at each nozzle exit. With reference to FIG. 5, the following parameters are considered. The characteristic length employed in determining the vapor discharge Reynolds number is the hydraulic diameter of the nozzle, defined as four times the nozzle cross-sectional area divided by wetted perimeter of the nozzle opening:

$$D = \frac{4ae}{2(a+e)}$$

Since $a$ is much less than $e$ the hydraulic diameter approximates $2a$. The temperature of the flowing vapor-gas mixture is considered to be the average oil temperature across the nozzle determined from measured inlet and outlet oil temperatures. The density and viscosity of the vapor-gas mixture are determined to be the density and viscosity of the mixture at the nozzle temperature and vaporization chamber pressure. In general the properties of the carrier gas at that temperature and pressure are satisfactory. The flow velocity is determined from the mass flow to the vaporizer divided by the density of the mixture as indicated further divided by the total area of the nozzle exit openings (number of nozzles multiplied by $[a \cdot e]$).

The following examples illustrate the importance of nozzle exit Reynolds number and nozzle-to-substrate spacing.

EXAMPLE I

An experimental apparatus having a single nozzle like that described above having the following characteristics is employed for the tests described below. The apparatus has a motor driven fan capable of delivering 3000 liter/minute of gas. A 5 kilowatt heating coil is provided downstream of the fan with the heating coil located in the duct through which the gas flows from the fan to the nozzle. A thermocouple is located in the wall of the duct immediately upstream of the nozzle, and this thermocouple is connected to a temperature regulator which is connected to and controls the power to the heating coil. A substrate support is positioned opposite the nozzle opening. The substrate support is positioned opposite the nozzle opening. The substrate support is provided with means for heating the substrate, and a series of thermocouples are provided for monitoring substrate temperature. The support is constructed to hold a flat substrate in a plane perpendicular to a plane defined through center of the nozzle along the axis of discharged gas flow.

An optical interferometer (MACH-ZEHNDER) is provided in surrounding relation to the experimental apparatus. The interferometer is positioned so that the center of its line of sight is in the plane defined by the axis of gas flow and is parallel to the plane of a substrate. The interferometer employs two coherent monochromatic light beams, each having a wavelength of 546 nanometers (mercury arc lamp with narrow band green filter). Since the anticipated flow fields to be studied exhibit a substantial temperature gradient, a rotating mirror system is used in the interferometer. A rotation rate providing for 200 orders of interference is employed. Optical interference is recorded using a camera, and the resulting photographs reveal temperature profiles by a comparison of fringe shifts in terms of fringe widths in accordance with the well known principles of interferometry. As derived from the Gladstone-Dale relationship, a shift of $n$ fringe spaces indicates a temperature difference of $n \cdot \Delta\theta$ where $\Delta\theta$ is the difference between the local temperature at the fringe and the reference temperature, $\theta_R$, which is the bulk carrier gas temperature detected under quiescent conditions.

The apparatus was operated first with a nozzle-to-substrate spacing of two times the nozzle width (one times hydraulic diameter). Heated air alone was discharged at several flow rates characterized as having Reynolds numbers of 900, 1500, 2000, 2500, 4000 and 5000.

The heated gas (air) which is discharged against the substrates must turn 90° in the vicinity of the substrate. The beginning of this turn is observed from the interferograms (the photographs of the interfered light) to be about 0.8 times the nozzle width, a, above the substrate. At Reynolds numbers at and above 2500 a pronounced sharp boundary region of uniform density is observed adjacent the substrate. This is indicative of uniform and efficient deposition conditions. Also at and above a Reynolds number of 2500 the width of the effective flow contact with the substrate is observed to be substantially greater than the nozzle width so that the coating reactants can be effectively spread over the substrate surface.

The experiments when repeated with substrate temperatures ranging from 930°F. to 1025°F. reveal no significant variation with substrate temperature.

The experiments are repeated with the nozzle-to-substrate spacing varied. Spacing ratios of $b/a = 4$, $b/a = 2$ and $b/a = 1$ are tested.

For a spacing ratio of 4 the interferograms reveal gas density maps exhibiting a sufficiently broad region of uniformity near the substrate for uniform coating at a Reynolds number of 5000. At lower Reynolds numbers the region is diminished and below a Reynolds number of about 2500 the density map suggests the likelihood of non-uniform coating.

For a spacing ratio of 2 the interferograms reveal gas density maps exhibiting a divergence of the flow into a uniform coating region beginning at about 0.67 times the nozzle width above the substrate. At this spacing ratio flow oscillations which were apparent at a greater spacing ratio are absent and the flow and density fields remain uniform with respect to time. Even below a Reynolds number of 2500 a small uniform coating region is observed and above a Reynolds number of 2500 the width of the region exceeds the nozzle width and at a Reynolds number of 5000 the region width is about two times the nozzle width.

For a spacing ratio of 1 the interferograms reveal gas density maps exhibiting sharply turning flows creating variable pressure fields. This tends to destroy the effect of the discharge flow and the higher Reynolds numbers within the preferred range are reached with a uniform coating region still confined to about the width of the nozzle.

Further reduction of the spacing ratio requires higher Reynolds numbers. Despite any a priori thought that improvements might be made by moving the nozzle closer to the substrate any boundary penetration which might be expected is found to be offset by non-uniform conditions observed experimentally.

While the example described above establishes the significance of Reynolds number and nozzle-to-substrate spacing for vapor coating insofar as their significance may be deduced from gas density variations and other conditions in the vicinity of a substrate, the example which follows describes coating a glass substrate according to the preferred embodiment of this invention.

EXAMPLE II

The apparatus shown and described above is positioned across a float formed ribbon of glass between a float forming bath and an annealing lehr.

A continuous ribbon of clear glass approximately ten feet wide and about ¼ inch thick is conveyed beneath the device at a linear velocity of about 250 inches per minute. The glass is a conventional soda-lime-silica glass having a visible light transmittance of about 88 percent.

A coating solution is prepared. The solution has the following composition on a one gallon basis.

| | |
|---|---|
| Iron acetylacetonate | 510 grams |
| Chromium acetylacetonate | 150 grams |
| Cobalt acetylacetonate | 55 grams |
| Methylene chloride | 1 gallon |

The coating solution is delivered to the solution line 17 at a rate of about 0.2 gallon per minute, at a pressure of about 10 psig and at a temperature of about 70°F. Atomization air is supplied to the atomization gas line 23 at a pressure of about 5 psig and at a temperature of about 70°F.

Carrier ar is delivered to the carrier gas manifold 26 at about 38 psig and at a rate of about 170 SCFM. The carrier air is heated to about 500°F. in the preheaters 29 and is delivered to the vaporizer chamber 14 with the air velocity through the distributor plates 33 being about 5 to 10 feet per minute. The sensible heat in the air is sufficient to vaporize the coating solution and to establish the resulting air-vapor mixture temperature within the range of about 400°F. to 420°F.

Hot oil is supplied to all heaters at a temperature of about 410°F. Thus, the coating mixture leaving the vaporizer chamber 14 and passing through the plenum 38 and nozzles 43 has a stabilized temperature of about 410°F. The glass temperature beneath the nozzles is about 1050°F.

The nozzle-to-substrate spacing is $b/a = 2$. The described conditions provide a nozzle exit flow Reynolds number of 5000. The Reynolds number is based on the viscosity of air at 410°F. and the density of the air-methylene chloride mixture at 410°F. and one atmosphere pressure. Mass flow is directly utilized from the known input.

The apparatus is operated for a period of 20 minutes to coat about 200 square feet of glass. The resulting coating is uniform over the surface of the glass with the average visible light transmittance of the coated glass being 40 percent and the variation of transmittance being less than ± 2 percent except for the extreme marginal edges of the glass extending beyond the major dimension of the nozzles.

The coating is observed to be more uniform and have a much more finely grained appearance than coatings produced by spray methods using the same coating materials.

EXAMPLE III

The method of Example II is repeated several times except that in each instance some process parameter is varied to determine its influence upon the coatings produced.

First, the method is repeated with the exit flow having a Reynolds number of 2500. The resulting coating is of excellent quality as in Example II although the overall average transmittance is only 50 percent indicating somewhat less coating or deposition efficiency than in the preferred practice of the invention.

Second, the method is repeated with the exit flow having a Reynolds number of 2000. The resulting coating is thinner and less uniform than in the previous example; the average transmittance is only 60 percent with the transmittance range being ± 5 percent which is unacceptable for architectural applications.

Third, the method is repeated with the exit flow having a Reynolds number of 7000. The resulting coating is of excellent quality as in Example II.

Finally, two runs are made with the exit flow having a Reynolds number of 5000. In one run the nozzle-to-substrate spacing is 0.9 times the nozzle width and in the other the spacing is 5 times the nozzle width. The resulting coating in each instance is sufficient to provide an overall average transmittance of less than 50 percent but the variation in each instance is about ± 3 percent indicating marginal quality for many architectural uses.

We claim:

1. An apparatus for applying a coating to a substrate by directing a gaseous mixture comprising at least one coating reactant through a nozzle against a substrate comprising
   a. An enclosed chamber having inlet means for receiving a vaporizable coating reactant and a gaseous carrier for mixing the coating reactant with the gaseous carrier to provide a resulting gaseous mixture at a specified first pressure,
   b. conduit means interconnecting said chamber and a nozzle for distributing the resulting gaseous mixture to said nozzle,
   c. a nozzle comprising an elongated slot having an entrance end and an exit end that is smaller than the entrance end and having interior surfaces of increasing radii of curvature from the entrance end to the exit end to accelerate flow of the gaseous mixture adjacent the interior surfaces of the nozzle,
   d. said nozzle connected at its entrance to said conduit means for directing the resulting gaseous mixture against the substrate at a second specified pressure less than the first specified pressure,
   e. said nozzle entrance and exit flow areas being sized for directing the resulting gaseous mixture at an exit Reynolds Number of at least about 2500 when the resulting gaseous mixture exits said enclosed chamber at the first specified pressure, and
   f. means for supporting a substrate in facing relationship to said nozzle exit whereby said coating is applied.

2. The apparatus for applying a coating according to claim 1 wherein said means for supporting conveys the substrate in a path substantially transverse to the major dimension of said elongated slot.

3. The apparatus for applying a coating according to claim 1 wherein the surfaces of said nozzle adjacent the interior faces of said nozzle at the exit thereof form an angle less than about 90° with said adjacent interior faces.

4. The apparatus for applying a coating according to claim 3 wherein said angle is about 87°.

5. The apparatus for applying a coating according to claim 1 wherein said apparatus further comprises means for positioning the exit of said nozzle from the facing surface of said substrate a distance of at least 0.5 times the minor dimension of said nozzle exit.

6. The apparatus for applying a coating according to claim 5 wherein the distance from said nozzle exit to the facing surface of a supported substrate is from about 1.25 to about 5 times the minor dimension of said nozzle exit.

7. The apparatus as set forth in claim 1 wherein said substrate support means are provided in proximate relation to said nozzle exit end such that the centerline of gaseous flow from said nozzle exit end is substantially normal to the principal plane of a supported substrate and the spacing from the exit end of said nozzle to the facing surface of the supported substrate is at least about 0.5 times the minor dimension of said nozzle exit end.

8. The apparatus for applying a coating according to claim 7 wherein the nozzle exit end-to-substrate spacing is from about 0.65 to about 5 times the minor dimension of said nozzle exit end.

9. The apparatus for applying a coating according to claim 7 wherein the nozzle exit end-to-substrate spacing is from about 1.25 to about 5 times the minor dimension of said nozzle exit end.

10. The apparatus for applying a coating according to claim 7 wherein said means supporting comprises means for conveying the substrate past said nozzle with (1) the major dimension of said nozzle slot substantially transverse to the direction of substrate conveyance, (2) the projection of the major dimension of said nozzle to a plane normal to both said substrate and to the direction of said substrate travel and (3) the major dimension of said nozzle being less than the width of said substrate normal to the direction of travel of said substrate.

11. The apparatus for applying a coating according to claim 7 wherein the nozzle exit end-to-substrate spacing is from about 1.25 to about 5 times the minor dimension of said nozzle exit and said combination is provided with means for distributing said gaseous mixture substantially uniformly to said nozzle along its major dimension.

12. The apparatus for applying a coating according to claim 7 wherein said nozzle is provided with means for maintaining the temperature of said gaseous mixture flowing therethrough.

13. The apparatus as set forth in claim 10 wherein said conveying means are mounted between an exit end of a forming chamber and an entrance end of an annealing lehr.

14. The apparatus as set forth in claim 1 wherein the exit Reynold's number is about 5,000.

* * * * *

UNITED STATES PATENT OFFICE
CERTIFICATE OF CORRECTION

PATENT NO. : 3,951,100

DATED : April 20, 1976

INVENTOR(S) : John F. Sopko et al

It is certified that error appears in the above-identified patent and that said Letters Patent are hereby corrected as shown below:

In the reference section, under the German Patent No. 748,944, please delete "1946" and insert --1944--.

Signed and Sealed this twenty-second Day of June 1976

[SEAL]

Attest:

RUTH C. MASON
Attesting Officer

C. MARSHALL DANN
Commissioner of Patents and Trademarks